(12) United States Patent
Shinichi

(10) Patent No.: US 6,559,803 B2
(45) Date of Patent: May 6, 2003

(54) PORTABLE COMMUNICATION TERMINAL WITH REDUCED SPECIFIC ABSORPTION RATE

(75) Inventor: Haruyama Shinichi, Yokohama (JP)

(73) Assignees: Samsung Yokohama Research Institute (JP); Samsung Electronics, Co., Ltd. (KR)

(*) Notice: Subject to any disclaimer, the term of this patent is extended or adjusted under 35 U.S.C. 154(b) by 0 days.

(21) Appl. No.: 10/010,318

(22) Filed: Nov. 13, 2001

(65) Prior Publication Data

US 2002/0057224 A1 May 16, 2002

(30) Foreign Application Priority Data

Nov. 13, 2000 (JP) .......................................... 2000-345450

(51) Int. Cl.$^7$ .................................................. H01Q 1/24
(52) U.S. Cl. ...................................................... 343/702
(58) Field of Search ........................... 343/702, 700 MS, 343/873, 770, 767, 790

(56) References Cited

U.S. PATENT DOCUMENTS 6,005,524 A * 12/1999 Hayes et al. ................. 343/702
6,031,503 A * 2/2000 Preiss, II et al. ........... 343/770
6,259,417 B1 * 7/2001 Kim et al. ................... 343/841

* cited by examiner

Primary Examiner—James Clinger
(74) Attorney, Agent, or Firm—Dilworth & Barrese, LLP

(57) ABSTRACT

Disclosed is a portable communication terminal having an antenna structure capable of achieving a reduction in specific absorption rate (SAR) without preventing earth current from flowing through a PCB of the terminal. A sleeve antenna is arranged opposite to a speaker mounted to a printed circuit board (PCB) in the body of the terminal. The sleeve antenna includes an antenna element formed on an antenna PCB, and a dielectric sleeve. The sleeve antenna is connected to a transmitting/receiving circuit via a coaxial cable. The dielectric sleeve is mounted to a tip of the coaxial cable. The coaxial cable has an outer conductor connected to the inner peripheral conductor of the dielectric sleeve, and a central conductor connected to the feeding point of the antenna element. In accordance with this configuration, there is no antenna current flowing through the PCB. The PCB also serves as an electromagnetic shield plate. Accordingly, a reduction in SAR is achieved.

3 Claims, 9 Drawing Sheets

PORTABLE COMMUNICATION TERMINAL WITH REDUCED SPECIFIC ABSORPTION RATE

This application claims priority to an application entitled "Portable Communication Terminal with Reduced Specific Absorption Rate", filed in the Japanese Patent Office on Nov. 13, 2000 and assigned Serial No. 2,000-345,450, the contents of which are hereby incorporated by reference.

BACKGROUND OF THE INVENTION

1. Field of the Invention

The present invention relates generally to a portable communication terminal, and in particular, to a portable communication terminal with a reduced specific absorption rate (an indicator of the influence of electric waves on the human body).

2. Description of the Related Art

As the use of electronic and electric appliances has rapidly increased, much attention has been paid to the effects on the human body, in particular, the head, when it is exposed to electromagnetic waves radiated from these electronic and electromagnetic appliances. In particular, a specific absorption rate (SAR) is used to quantify the amount of electromagnetic energy absorbed by the human body exposed to electromagnetic waves radiated from a portable communication terminal such as a portable telephone, personal handyphone system (PHS) or personal digital assistant (PDA). In such a portable communication terminal, current concentrates on the antenna of the terminal. As a result, electromagnetic fields are concentrated about the head of the user to which a radiation source, i.e., the feeding point of the antenna, is closely positioned. This results in an increase in SAR. Currently, a number of research efforts are being made to achieve a reduction in SAR. Also, guidelines for the protection of the human body from electromagnetic waves are being established.

FIGS. 8a and 8b illustrate the structure of a monopole antenna commonly used in conventional portable telephones, and current and voltage distributions exhibited during the operation of the antenna. Referring to FIG. 8a, a printed circuit board (PCB) 1 mounted to a phone body is illustrated. As shown in FIG. 8a, a ¼-λ monopole antenna 2 is connected to the PCB 1 via a feeding point 3. The monopole antenna 2 includes a pole and an antenna earth plate. Antenna current Ia flowing through the antenna 2 causes earth current Ie to flow through the PCB 1 serving as the earth plate.

FIGS. 9a and 9b illustrate distributions of near electric field and near magnetic field formed by the antenna current Ia and earth current Ie flowing through the antenna 2 as illustrated in FIG. 8b. In FIGS. 9a and 9b, the reference numeral 4 denotes a phone body, and the reference numeral 5 denotes the head of the user. As shown in FIGS. 9a and 9b, electromagnetic fields caused by the earth current Ie concentrate on a position near the head 5. As a result, an increase in SAR occurs.

It may be possible to achieve a reduction in SAR in the above-mentioned configuration by reducing the intensity of near electromagnetic fields acting around the head of the user. In this configuration, however, the antenna structure of FIGS. 8a and 8b has the following problems:

(1) In the above mentioned ¼-λ monopole antenna structure, earth current Ie flows through the PCB 1 of the phone body 4 because the PCB 1 serves as an earth plate. However, it is difficult to control the earth current Ie flowing through the PCB 1. For this reason, it is difficult to control near electromagnetic fields in order to reduce the intensity thereof;

(2) Antenna current Ia concentrates on a position near the feeding point 3 of the antenna. However, the head 5 is typically positioned close to the feeding point 3; and (3) Taking into consideration this fact, use of a separate shield plate has been proposed in order to reduce radiation of electromagnetic intensity toward the head. In the above mentioned monopole antenna structure, however, poor shielding effects are obtained because the earth current Ie flowing through the PCB also flows through the shield plate.

SUMMARY OF THE INVENTION

Therefore, the present invention has been made in view of the above-mentioned problems, and an object of the present invention is to provide a portable communication terminal having an antenna structure capable of reducing the intensity of electromagnetic fields acting around the head of the user without preventing earth current from flowing through a PCB of the terminal.

In accordance with the present invention, this object is accomplished by providing a portable communication terminal comprising: an antenna board mounted to a surface of a printed circuit board mounted with at least one speaker, the surface of the printed circuit board being opposite to a speaker-mounted surface of the printed circuit board; a first antenna element formed, in the form of an antenna pattern, on the antenna board; a coaxial cable for feeding power to the first antenna element; and a first dielectric sleeve mounted to a tip of the coaxial cable.

The portable communication terminal may further comprise a second antenna element formed in the form of an antenna pattern on the antenna board, and a second coaxial cable coaxially fitted around the first dielectric sleeve. The antenna board and the dielectric sleeves may be electrically suspended from the printed circuit board.

BRIEF DESCRIPTION OF THE DRAWINGS

The above objects and advantages of the present invention will become more apparent from the following detailed description when taken in conjunction with the accompanying drawings in which:

FIGS. 1a to 1c illustrate a principal antenna structure in a portable telephone, such as a portable communication terminal, in which, FIG. 1a is a plan view, FIG. 1b is a side view, and FIG. 1c is a front view illustrating the condition of use of the portable telephone;

DETAILED DESCRIPTION OF THE PREFERRED EMBODIMENTS

Figure 1:
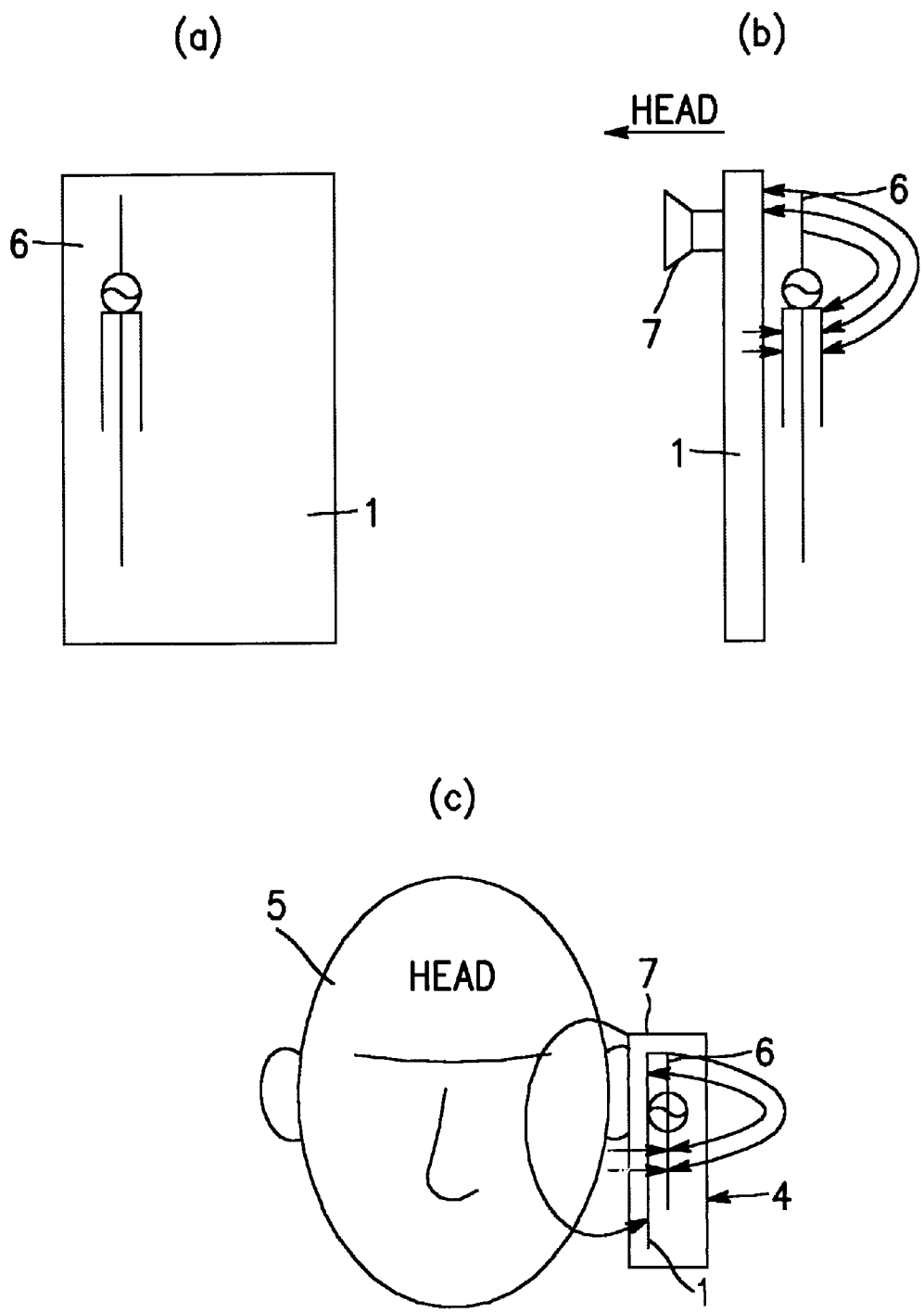

Preferred embodiments of the present invention will be described herein below with reference to the accompanying drawings. In the drawings, the same or similar elements are denoted by the same reference numerals even though they are depicted in different drawings. In the following description, well-known functions or constructions are not described in detail since they would obscure the invention in unnecessary detail.

FIGS. 1a to 1c are schematic views illustrating a principal antenna structure in a portable telephone, such as a portable communication terminal. FIG. 1a is a plan view, FIG. 1b is a side view, and FIG. 1c is a front view illustrating the condition of use of the portable telephone. In FIGS. 1a to 1c, the reference numeral 4 denotes a phone body, reference numeral 1 denotes a PCB mounted in the phone body 4, reference numeral 6 denotes a sleeve antenna mounted to the PCB 1, and reference numeral 7 denotes a speaker. The speaker 7 is attached to the surface of the PCB 1 opposite to the PCB surface to which the sleeve antenna 6 is mounted.

When power is conducted through the sleeve antenna 6 arranged at an appropriate position on the PCB 1, as illustrated in FIG. 1a, there is no antenna resonant current leaking toward a coaxial cable by virtue of the function of the sleeve antenna 6. As a result, no earth current flows through the PCB 1. When a user uses the portable telephone, his head 5 faces the speaker 7 mounted to the PCB 1, as shown in FIG. 1c. In this case, the PCB 1 serves as an electromagnetic shield plate, thereby reducing the intensity of near electromagnetic fields acting around the head 5. Accordingly, it is possible to achieve a reduction in SAR.

Figure 2:
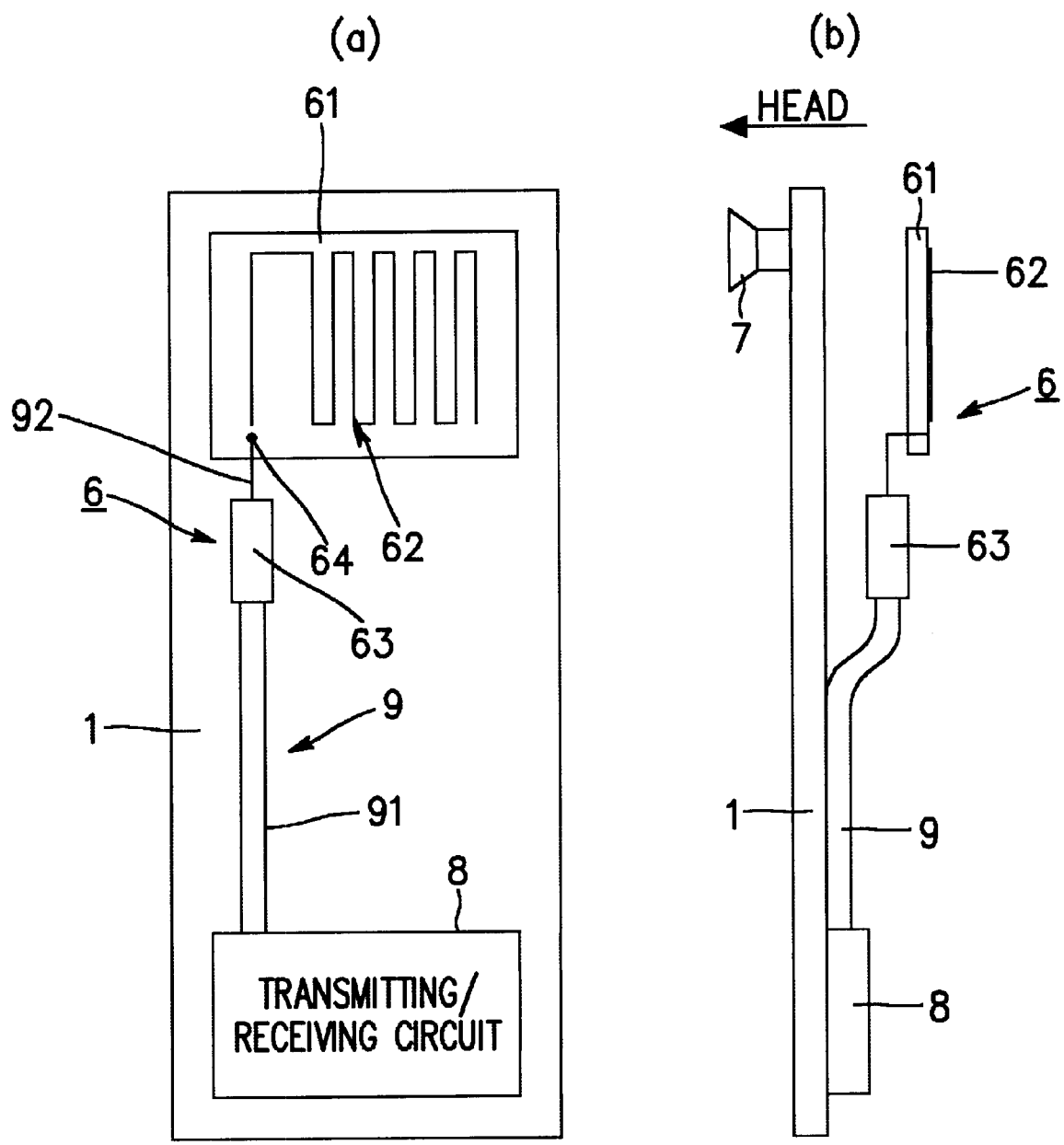
FIGS. 2a and 2b are plan and side views illustrating an antenna structure according to a first embodiment of the present invention.
Figure 3:
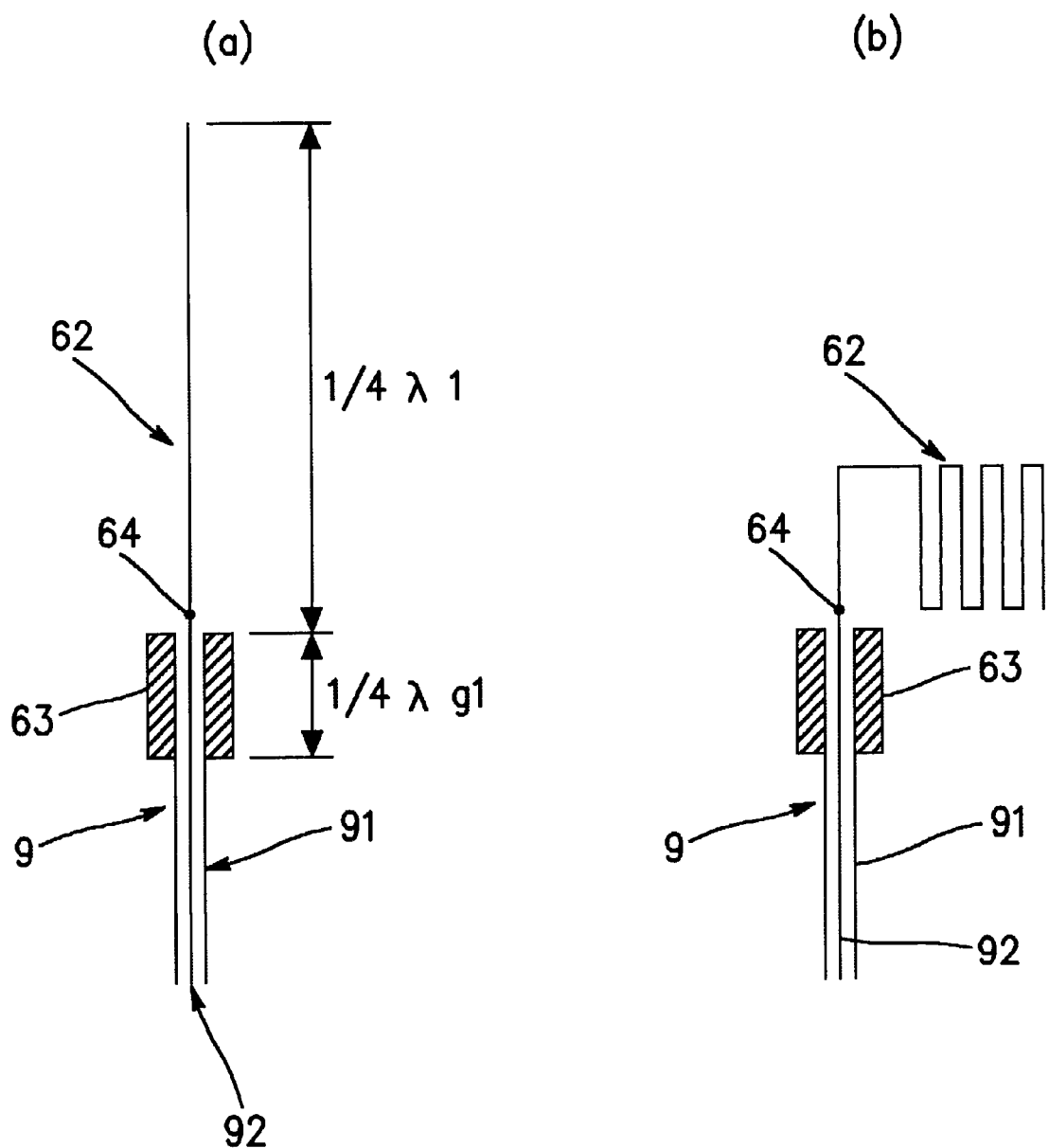
FIGS. 3a and 3b are plan and side views illustrating an electrical structure of the antenna according to the first embodiment of the present invention.

FIGS. 2a to 3b illustrate an antenna structure according to a first embodiment of the present invention based on the principle illustrated in FIGS. 1a and 1b. Referring to FIGS. 2a to 3b, a sleeve antenna 6 is illustrated which includes an antenna PCB 61 arranged at an upper portion of the PCB 1, a ¼·λ antenna element 62 formed in the form of an antenna pattern on the antenna PCB 61, and a dielectric sleeve 63 having an electrical length of ¼·λg1. As shown in FIG. 2a, the pattern of the antenna element 62 has the form of a meander line in order to allow the antenna to have a reduced height.

A transmitting/receiving circuit 8 is arranged at a lower portion of the PCB 1. This transmitting/receiving circuit 8 is connected with the sleeve antenna 6 via a coaxial cable 9. As shown in FIG. 2a, the coaxial cable 9 is fitted in the dielectric sleeve 63 at its tip in such a fashion that its outer conductor 91 is in contact with the inner peripheral surface of the dielectric sleeve 63, whereas its central conductor 92 is connected to a feeding point 64 provided at one end of the antenna element 62. As shown in FIG. 2b, the coaxial cable 9 has a bent structure so as to electrically suspend the antenna PCB 61 and dielectric sleeve 63 from the PCB 1. In a general portable telephone, an antenna is arranged at the upper portion of the PCB, and a transmitting/receiving circuit is arranged at the lower portion of the PCB, as illustrated in FIG. 1a.

Figure 4:
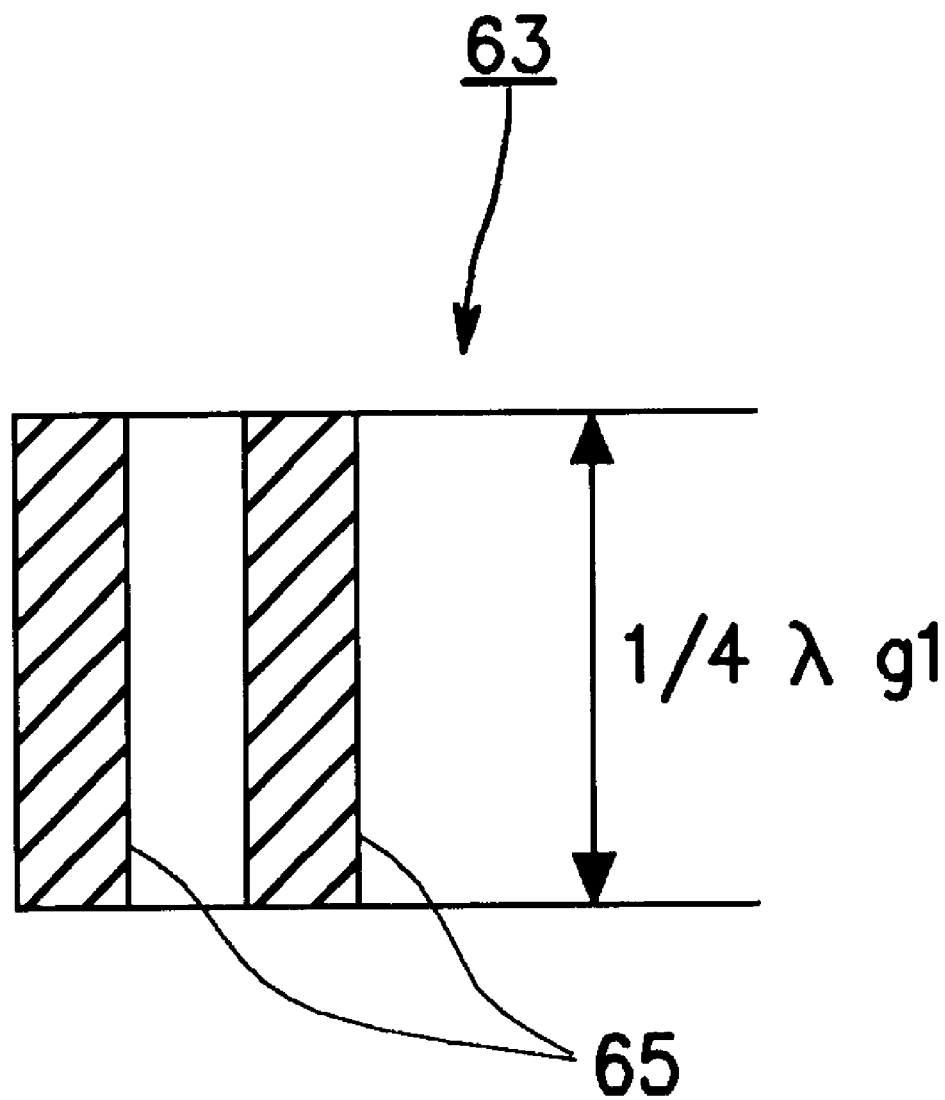
FIG. 4 is a sectional view illustrating a dielectric sleeve as illustrated in FIGS. 2a to 3b.
Figure 5:
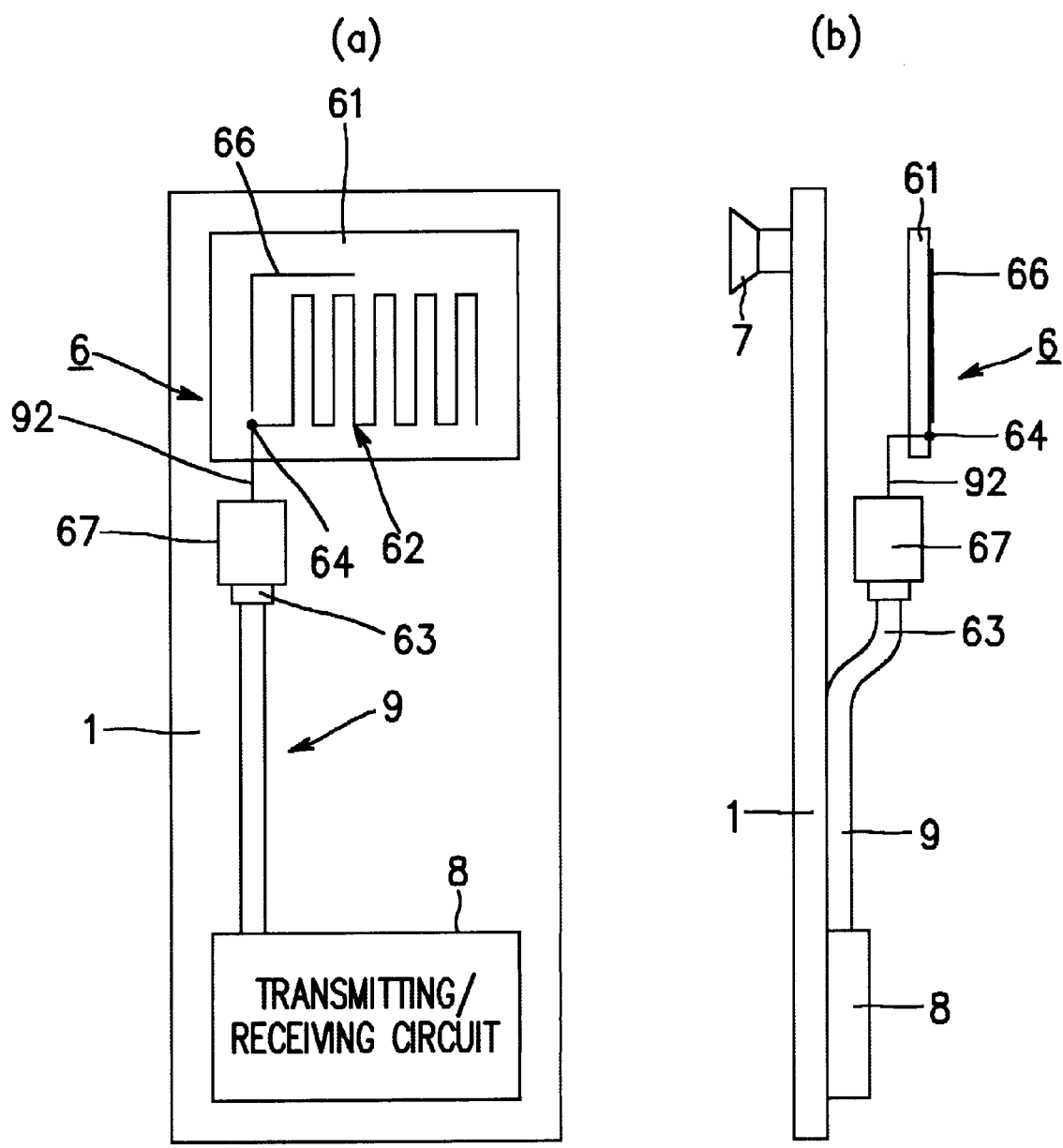
FIGS. 5a and 5b are plan and side views illustrating an antenna structure according to a second embodiment of the present invention.
Figure 6:
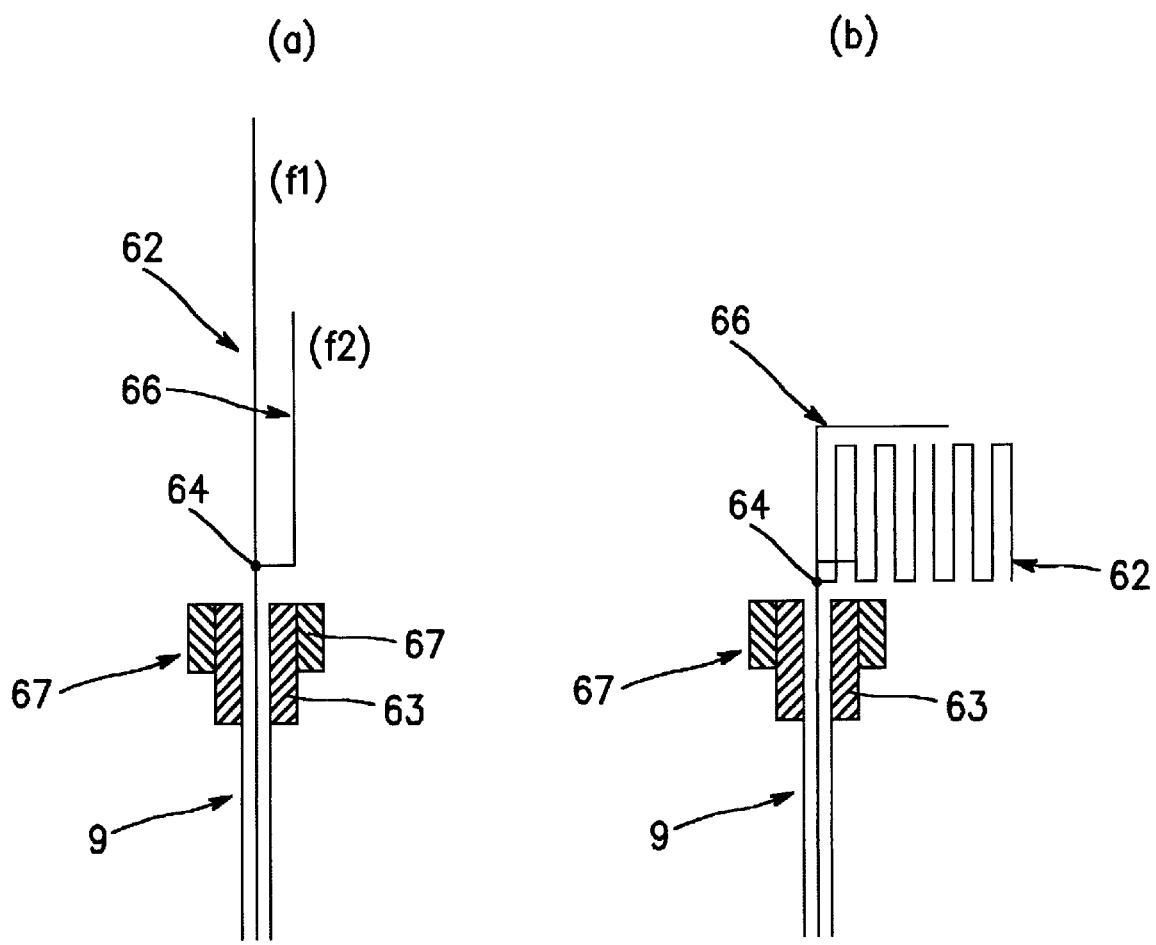
FIGS. 6a and 6b are plan and side views illustrating an electrical structure of the antenna according to the second embodiment of the present invention.
Figure 7:
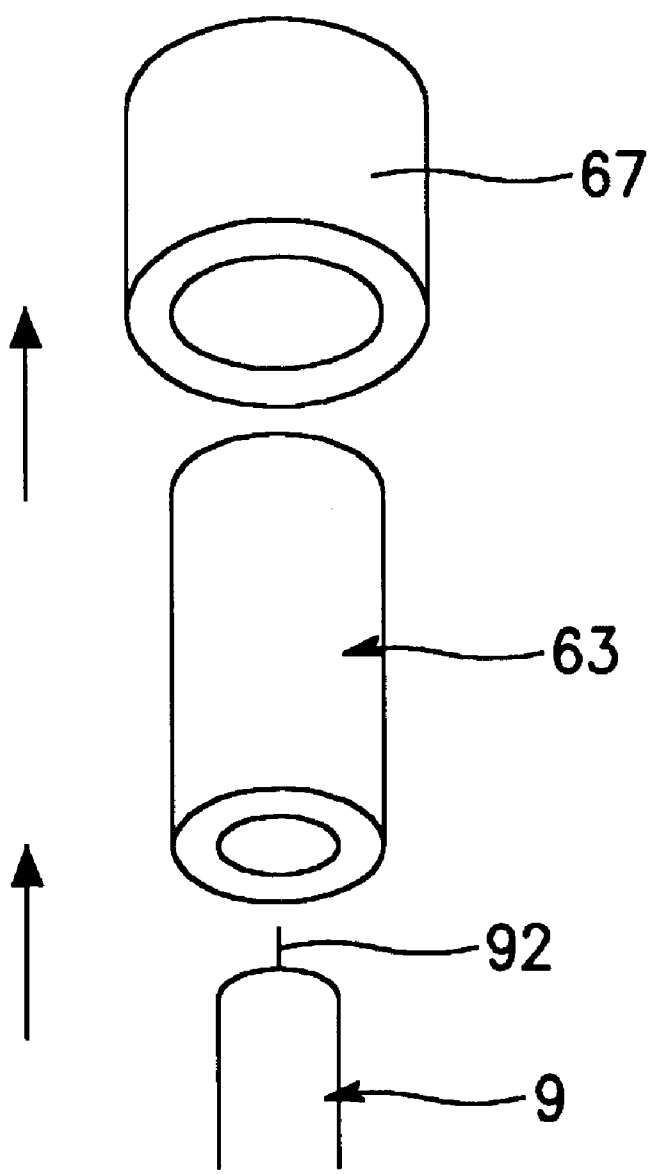
FIG. 7 is a perspective view illustrating dielectric sleeves illustrated in FIGS. 5a to 6b.
Figure 8:
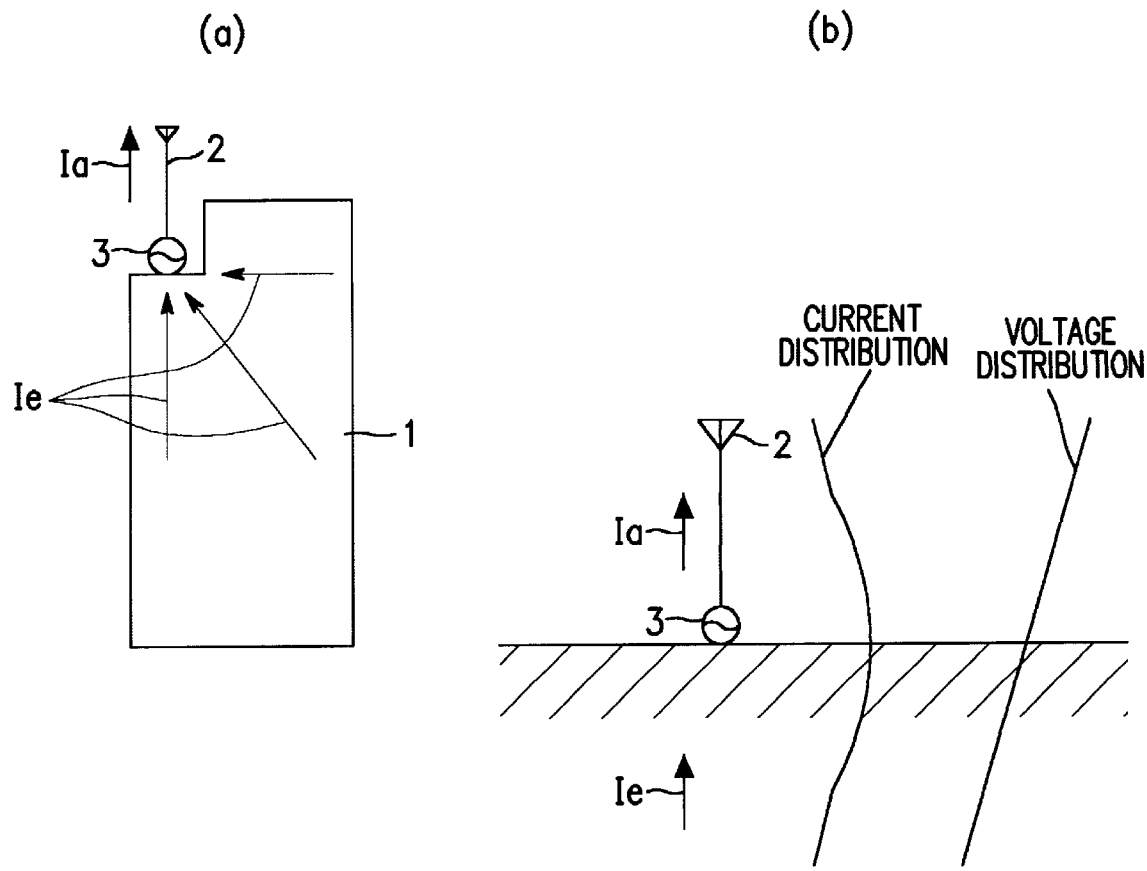
FIGS. 8a and 8b illustrate the structure of a monopole antenna attached to a conventional portable communication terminal and current and voltage distributions formed at the terminal.
Figure 9:
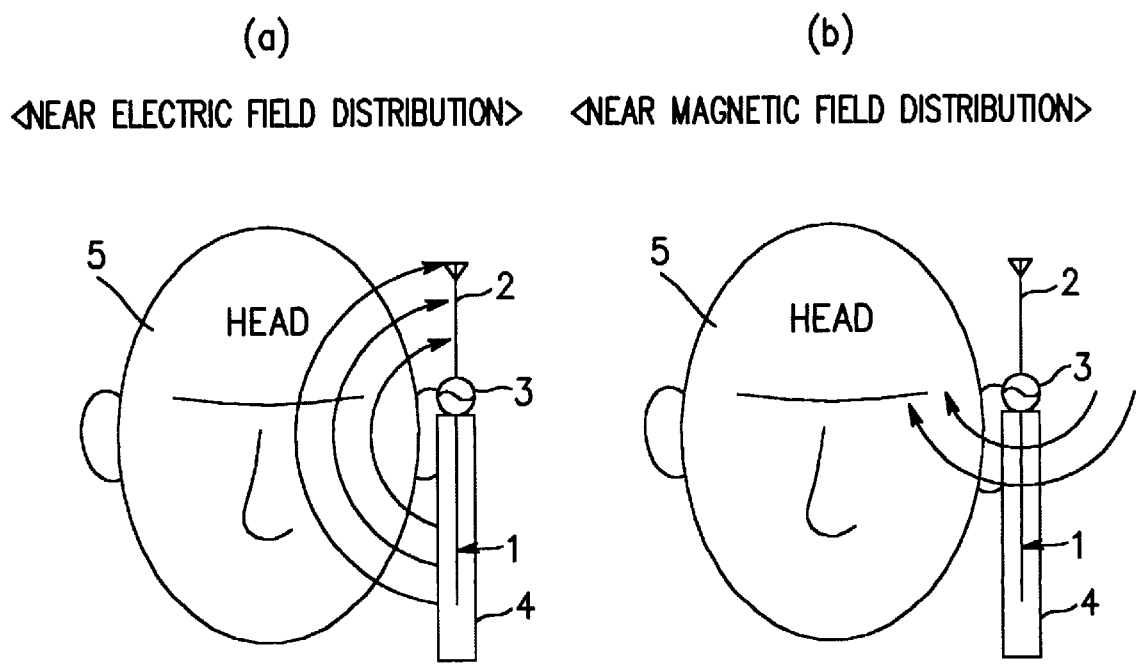
FIGS. 9a and 9b are schematic views illustrating distributions of a near electric field and a near magnetic field formed at the antenna of the conventional portable communication terminal.

FIG. 4 is a sectional view illustrating the structure of the dielectric sleeve 63 illustrated in FIGS. 2a to 3b. The dielectric sleeve 63 is made of dielectric ceramic. As shown in FIG. 4, the dielectric sleeve 63 is covered by a conductor 65 at its outer and inner peripheral surfaces and its top surface. The dielectric sleeve 63 is opened at its bottom surface. Thus, the dielectric sleeve 63 comprises a ¼·λg1 wavelength coaxial resonator.

In the configuration illustrated in FIGS. 2a to 4, power from the transmitting/receiving circuit 8 is transmitted to the dielectric sleeve 63 via the coaxial cable 9. The coaxial cable 9 is coupled to the conductor 65 of the dielectric sleeve 63 at its outer conductor 91 while being coupled to the antenna element 62 at its central conductor 92 via the feeding point 64. As a result, the antenna element 62 and dielectric sleeve 63 form the same configuration as that of a dipole antenna having an electrical length of λg/2. That is, the antenna element 62 and dielectric sleeve 63 serve as a sleeve antenna, so that there is no antenna resonant current leaking toward the outer conductor 91. Accordingly, there is no earth current flowing through the PCB 1 of the phone.

In this case, the head 5 of the user faces the speaker 7 arranged opposite to the antenna of the PCB 1. Accordingly, the PCB 1 serves as a shield plate, thereby reducing the intensity of near electromagnetic fields acting around the head 5. Accordingly, it is possible to achieve a reduction in SAR.

FIGS. 5a to 6b illustrate an antenna structure according to a second embodiment of the present invention. In FIGS. 5a to 6b, respective elements corresponding to those in FIGS. 2a to 3b are denoted by the same reference numerals, and no further description thereof will be provided. This second embodiment is applied to a portable telephone having two usable frequencies f1 and f2.

In the structure illustrated in FIGS. 5a to 6b, the antenna element 62 and dielectric sleeve 63, which are described in conjunction with the first embodiment, are used for the frequency f1. For the frequency f2, this structure additionally includes a ¼·λg2 antenna element 66, and a ¼·λg2 dielectric sleeve 67. The antenna element 66 has a pattern formed on the antenna PCB 1. The antenna element 66 is connected to the feeding point 64 at one end thereof. The dielectric sleeve 67 has the same structure as the dielectric sleeve 63 shown in FIG. 4. This dielectric sleeve 67 is coaxially fitted around the dielectric sleeve 63, so that they form a double dielectric sleeve structure.

Alternatively, two different frequencies may be used using only one of the antenna elements 62 and 66. This can be implemented by incorporating a trap circuit in the antenna element to be used.

In accordance with this configuration, a sleeve antenna conducting independent operations at two frequencies f1 and f2 may be implemented. In this case, the PCB 1 serves as a shield plate in the same fashion as the first embodiment, thereby reducing the intensity of near electromagnetic fields acting around the head. Accordingly, it is possible to achieve a reduction in SAR.

The two frequencies f1 and f2 may be used in, for example, a PHS and a general portable telephone, respectively.

Although the present invention has been described in conjunction with the embodiments applied to portable telephones, it is not limited to those embodiments. That is, the present invention is also applicable to other portable communication terminals such as PDAs.

As apparent from the above description, the present invention provides a portable communication terminal including a sleeve antenna arranged opposite to a speaker mounted to a PCB of the terminal and adapted to prevent earth current from flowing through the PCB while allowing the PCB to serve as a shield plate, thereby being capable of reducing the intensity of electromagnetic fields acting around the head of the user. Thus, the present invention provides a small and inexpensive antenna structure capable of achieving a reduction in SAR.

In accordance with the present invention, it is possible to use two different frequencies by the provision of two sleeve antennas.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A portable communication terminal comprising:
   an antenna board mounted to a first surface of a printed circuit board to which is mounted at least one speaker, the first surface of the printed circuit board being opposite to the speaker-mounted surface of the printed circuit board;
   a first antenna element formed in an antenna pattern on the antenna board;
   a coaxial cable for feeding power to the first antenna element;
   a first dielectric sleeve mounted to a tip of the coaxial cable;
   a second antenna element formed in an antenna pattern on the antenna board; and
   a second coaxial cable coaxially fitted around the first dielectric sleeve forming a second dielectric sleeve.

2. The portable communication terminal according to claim 1, wherein the antenna board and the first dielectric sleeve are electrically suspended from the printed circuit board.

3. The portable communication terminal according to claim 1, wherein the antenna board and the first and second dielectric sleeves are electrically suspended from the printed circuit board.

* * * * *